(12) United States Patent
Sanders

(10) Patent No.: US 6,301,400 B1
(45) Date of Patent: Oct. 9, 2001

(54) FIBER OPTIC CURRENT SENSOR HAVING ROTATION IMMUNITY

(75) Inventor: Glen A. Sanders, Scottsdale, AZ (US)

(73) Assignee: NXTPhase Technologies Srl, Phoenix, AZ (US)

( * ) Notice: Subject to any disclaimer, the term of this patent is extended or adjusted under 35 U.S.C. 154(b) by 0 days.

(21) Appl. No.: 09/190,873

(22) Filed: Nov. 12, 1998

(51) Int. Cl.[7] ..................................................... G02B 6/00
(52) U.S. Cl. ........................ 385/12; 356/465; 250/227.14
(58) Field of Search .................................. 356/350, 465; 385/12, 13; 250/227.14, 227.19, 227.27

(56) References Cited

U.S. PATENT DOCUMENTS 5,644,397   7/1997   Blake .
5,696,858   12/1997  Blake .

FOREIGN PATENT DOCUMENTS 0 074 465   3/1983   (EP) .

OTHER PUBLICATIONS

Arditty, H. et al., "Current sensor using state–of–the–art fiber–optic interferometric techniques," IOOC '81: Third International Conference on Integrated Optics and Optical Fiber Communications, San Francisco, CA, USA. pp. 128–130, Apr. 1981.*

PCT search report, PCT/US 99/26499.

Bergh et al, geometrical Fiber Configuration for Isolators and Magnetometers, Proceedings of teh First Intl. Conference on Fiber–Optic Rotation Sensors and Related Technologies, Springer Series in Optical Sciences, vol. 32, Nov. 9–11, 1981, pp. 400–404.

* cited by examiner

Primary Examiner—Frank G. Font
Assistant Examiner—Andrew H. Lee

(57) ABSTRACT

An interferometric sensor having an optic fiber which forms a sensing loop optical path and a second loop that is wound in the opposite direction of the sensor loop. Circularly polarized light propagates along the optical path of the sensing loop. A differential phase shift is induced in the light waves by a magnetic field of the current in a conductor. The light waves with their phase relationship are detected by a photo detector which outputs an electrical signal that is processed by loop closure electronics into a signal indicative of the current's magnitude and direction. If the phase shift due to rotation is sensed in the sensing loop, then that phase shift is canceled by an opposite phase shift from the compensating loop. The compensating loop or coil may be reversed in connections, or flipped over, for calibrating the current sensor. Also, with a small sensor coil, delay line compensating coils may be used in the optical circuit, so that the bias modulation frequency can be made low enough for low drift loop closure electronics.

35 Claims, 7 Drawing Sheets

FIBER OPTIC CURRENT SENSOR HAVING ROTATION IMMUNITY

BACKGROUND OF THE INVENTION

The present invention relates in general to the field of fiber optic sensors. In particular, the invention relates to a fiber optic interferometric sensor. More particularly, it relates to magnetic field and current sensing with a Sagnac loop, not having rotation sensitivity.

Over the past decade, Sagnac interferometers have received attention in the application of magnetic field sensing and current sensing. Fiber optic current sensors are particularly advantageous over iron-core current transformers, since fiber optic sensors are non-conductive and lightweight. Furthermore, fiber optic sensors also do not exhibit hysteresis and provide a much larger dynamic range and frequency response.

Fiber optic current sensors work on the principle of the Faraday effect. Current flowing in a wire induces a magnetic field that, through the Faraday effect, rotates the plane of polarization of the light traveling in the optical fiber wound around the current carrying wire. Faraday's law, stated as $$I = \oint H \cdot dL$$

where I is the electrical current, H is the magnetic field and the integral is taken over a closed path around the current. If the sensing fiber is wound around the current carrying wire with an integral number of turns, and each point in the sensing fiber has a constant sensitivity to the magnetic field, then the rotation of the plane of polarization of the light in the fiber depends on the current being carried in the wire and is insensitive to all externally generated magnetic fields such as those caused by currents carried in nearby wires. The angle, $\Delta\phi$, through which the plane of polarization of light rotates in the presence of a magnetic field is given by $$\Delta\phi = V \int H \cdot dL$$

where V is the Verdet constant of the fiber glass. The sensing optical fiber effectively performs the line integral of the magnetic field along its path, which is proportional to the current in the wire, when that path closes on itself. Thus we have that $\Delta\phi = VNI$ where N is the number of turns of sensing fiber wound around the current carrying wire. The rotation of the state of polarization of the light due to the presence of an electrical current is measured by injecting light with a well defined linear polarization state into the sensing region, and then analyzing the polarization state of the light after it exits the sensing region.

A typical related-art optical fiber current sensor is disclosed in U.S. Pat. No. 5,644,397 issued Jul. 1, 1997 to inventor James N. Blake and entitled "Fiber Optic Interferometric Circuit and Magnet Field Sensor", which is incorporated herein by reference. Optical fiber current sensors are also disclosed in U.S. Pat. No. 5,696,858 issued Dec. 9, 1997 to inventor James N. Blake and entitled "Fiber Optics Apparatus and Method for Accurate Current Sensing", which is incorporated herein by reference.

The related-art sensing of current suffers from a number of difficulties. Exceptionally stable optical components are required for measuring the polarization state changes with the accuracy needed for certain applications such as revenue metering. In addition, birefringence present in the sensing region rotates the plane of polarization as well as current, yielding an indistinguishable signal. Mechanical disturbances such as vibrations in the sensing fiber can yield a time varying birefringence, which yields signals indistinguishable from time varying currents. Similarly, thermal disturbances may also produce erroneous results.

Accordingly, a need has arisen for a fiber optic current and magnetic field loop sensor that is insensitive to rotation and time-varying effects such as changing temperature and vibration, and does not require exceptionally stable optical components and low birefringence in the sensing region.

SUMMARY OF THE INVENTION

In accordance with the present invention, an optical interferometric current sensor configuration is provided which eliminates or substantially reduces the disadvantages associated with prior optical sensors.

The current sensor includes a polarization maintaining optic fiber forming a sensing loop and has a rotation-compensating fiber coil. Counter-propagating circularly polarized light waves propagate along the optical path and pass through a magnetic field-sensitive sensing medium. A differential phase shift induced in the light waves in the presence of a magnetic field, is then detected by a photo detector and the value of the sensed parameter is determined by the associated signal processing electronics.

An all-guided wave version of the current sensor has fiber quarter wave converters that are used to convert linearly polarized light into circularly polarized light. The quarter wave converter is preferably constructed from a short section of long beat length polarization maintaining fiber. The sensing medium or loop may be made from a low linear birefringence optical fiber or fiber with high circular birefringence. The latter can be made by spinning the fiber during fabrication.

The loop sensor configuration detects a magnetic field of a current conducted by a wire. However, the sensor known as a Sagnac interferometer is also sensitive to the rotational movement of the loop. This rotation effect is compensated with a fiber loop or coil inserted in the optical circuit. The compensation is for errors due to rotation or angular vibration of the sensing loop. The compensation loop or coil has the same rotation sensing product (RSP) of number of winding turns times the area enclosed by the loop or coil, as that of the current-sensing loop or coil. $N_s A_s = -N_c A_c$, where $N_c A_c$ is the RSP of the compensating coil and $N_s A_s$ is the RSP of the sensing coil. The minus (−) sign indicates that the compensating coil has a sensing axis polarity opposite to that of the current-sensing loop or coil. Thus, the rotation sensitivity of the compensating coil is equal and opposite of that of the sensing coil, resulting in no rotation sensitivity by the overall current sensor.

Another aspect of the invention is to fabricate the rotation compensating (RC) loop or coil with a fixture so that the coil or loop can be flipped over, i.e., the axis polarity of the compensation coil in the optical circuit is reversed. This permits the calibrating of the non-reciprocal optical phase shift of the sensor by measuring, and then removing or nulling out the effects of rotation rate for precise current sensing. A first reading of the sensor is made to measure or calibrate sensitivity to rotation and then the RC coil can be flipped over for a second reading of current only. This reveals the effects of rotation or vibration. Thus, the sensor can be first calibrated and then used for accurate current sensing without the rotation or vibration sensitivity. Alternatively, the compensating coil may be just left in place to continuously eliminate sensitivity to rotation.

The optical current sensor may have a sensing loop or coil with a small RSP and a delay line coil to lower the proper frequency of the Sagnac sensing loop or coil so that the bias modulation frequency can be low enough for low drift loop closure electronics. The delay line coil may have a large RSP relative to that of the sensing loop or coil and has only rotation sensitivity that is of concern. One may use, and oppositely wind a second delay line coil to null the rotation sensitivity of the first delay line coil.

DESCRIPTION OF THE EMBODIMENT

Figure 1A:
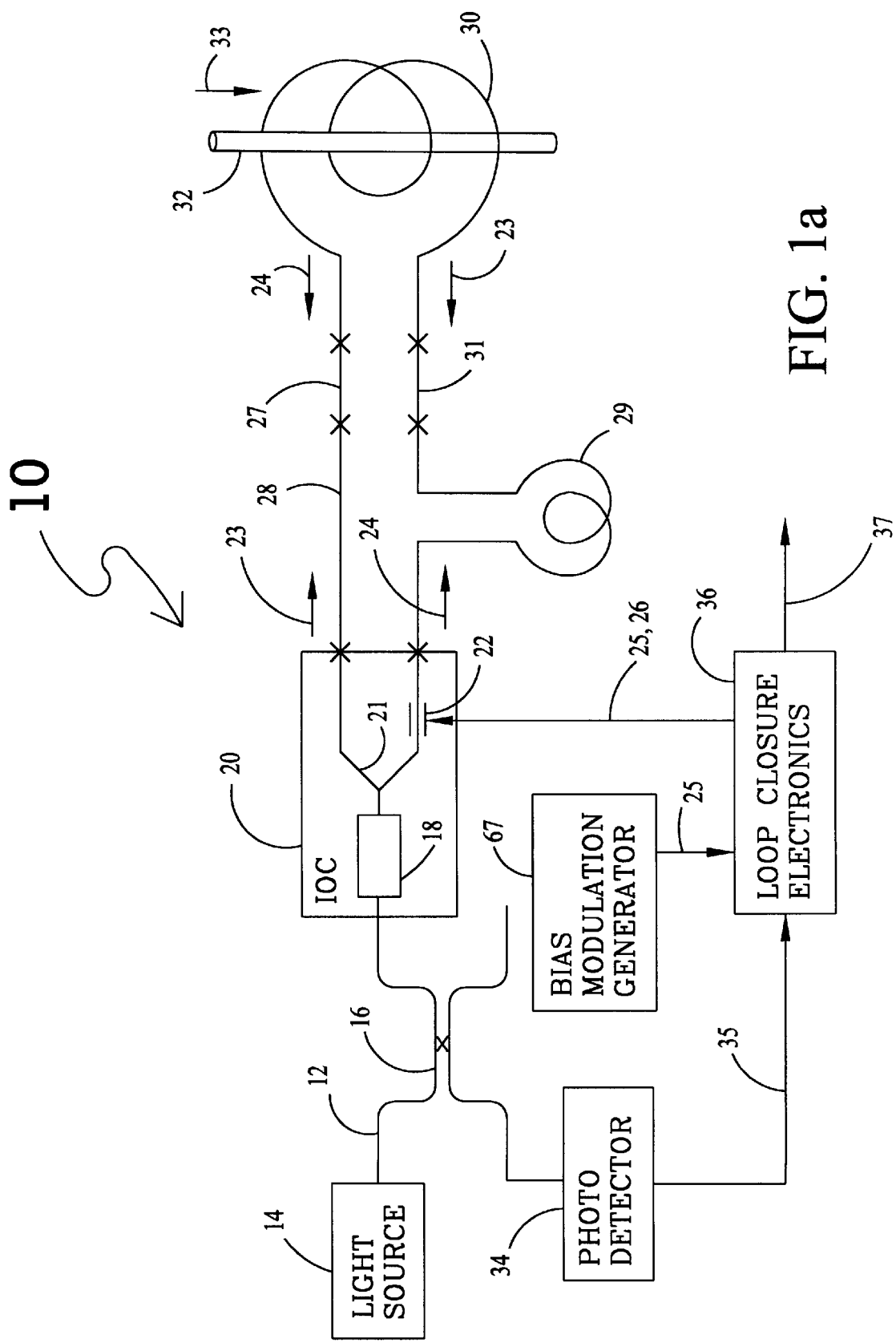
FIGS. 1a and 1b are schematic diagrams of a Sagnac current sensing loop having rotation compensation.

A sensor configuration based on the Sagnac loop is an all-guided-wave optical current sensor 10. Referring to figure 1a, the body of Sagnac interferometer current sensor 10 is constructed from polarization maintaining fiber. A light source 14 such as a superluminescent diode, a light emitting diode, a laser diode or rate-earth doped fiber light source generates a broadband light that is coupled into fiber 12. The light passes through a directional coupler 16 and is linearly polarized by a polarizer 18 of an integrated optic circuit (IOC) 20. The linearly polarized light is then coupled into the loop portion of the sensor as two counter-propagating linearly polarized light waves 23 and 24 by a wye junction coupler 21. A phase modulator 22 applies a periodic bias modulation signal 25 and a feedback signal 26 to phase modulate the counter-propagating light waves. Just before light wave 23 enters sensing coil 30, it passes through a quarter wave converter 27 having its principle axes oriented at 45 degrees with respect to the axes of polarization maintaining (PM) fiber 28. Light wave 23 goes on through sensing coil 30 which is composed of a low birefringence fiber or a fiber of high circular birefringence. Light wave 24 goes on through a rotation compensating (RC) coil 29 which is composed of a PM fiber. From coil 29 light wave 24 goes through a quarter wave converter 31 having its birefringent principal axes oriented at 45 degrees relative to the axes of the PM fiber of coil 29.

The purpose of quarter wave converters 27 and 31 is to convert the linearly polarized light 23 from polarization maintaining fiber 28 and linearly polarized light 24 from the PM fiber of coil 29 to circularly polarized light. There is no fundamental advantage of using right handed, as opposed to left handed circularly polarized light in sensing coil 30. Sensing coil 30 encircles conductor 32 that carries current 33 in a direction parallel to the sensing axis of coil 30. The sensing coil axis is perpendicular to a plane that a winding of the coil lies in. Exiting sensing coil 30, light wave 23 continues on and passes through quarter wave converter 31 and light wave 24 passes through quarter wave converter 27. Quarter wave converters 27 and 31 now convert both light waves 23 and 24 back to linearly polarized light aligned with an axis of the polarization maintaining fiber 28 and PM fiber coil 29, respectively. Returning light waves 23 and 24 pass through IOC 20 and directional coupler 16 and fall on a photo detector 34, which provides an output signal 35 to a loop closure electronics 36. Loop closure electronics 36 outputs bias modulation signal 25 and feedback signal 26 to modulator 22. Bias modulation generator 67 generates bias modulation signal 25 that is sent to loop closure electronics 36. Electronics 36 outputs signal 26 as the feedback signal to modulator 22 which causes counter-propagating light waves 23 and 24 to be brought into phase with each other. A variable characteristic of signal 26 is an indication of optical phase displacement caused by current 33 through wire 32. This characteristic of signal 26 is processed by electronics 36 into a signal 37 that indicates the magnitude and sign of sensed current 33.

Figure 1B:
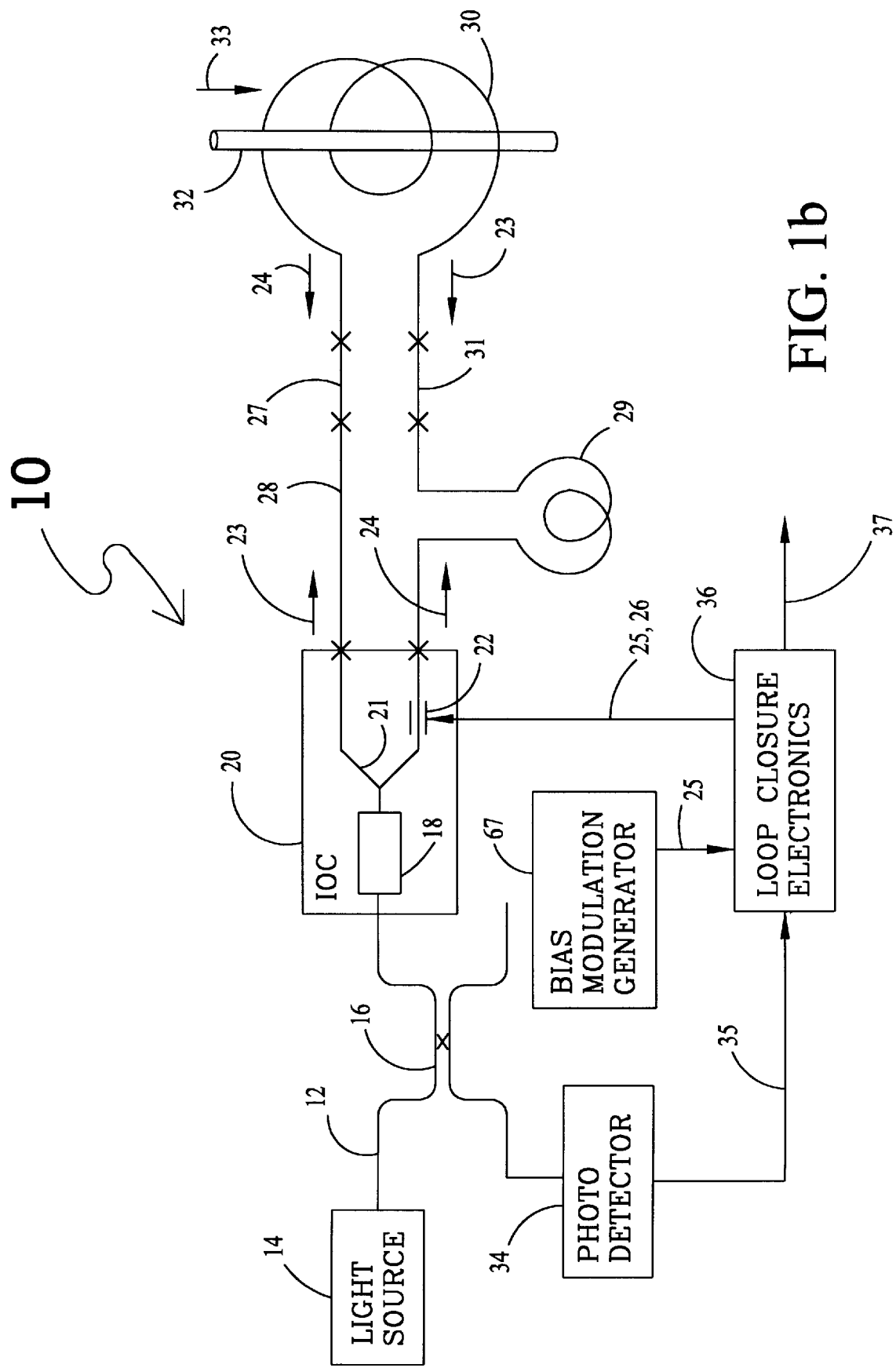
Figure 3:
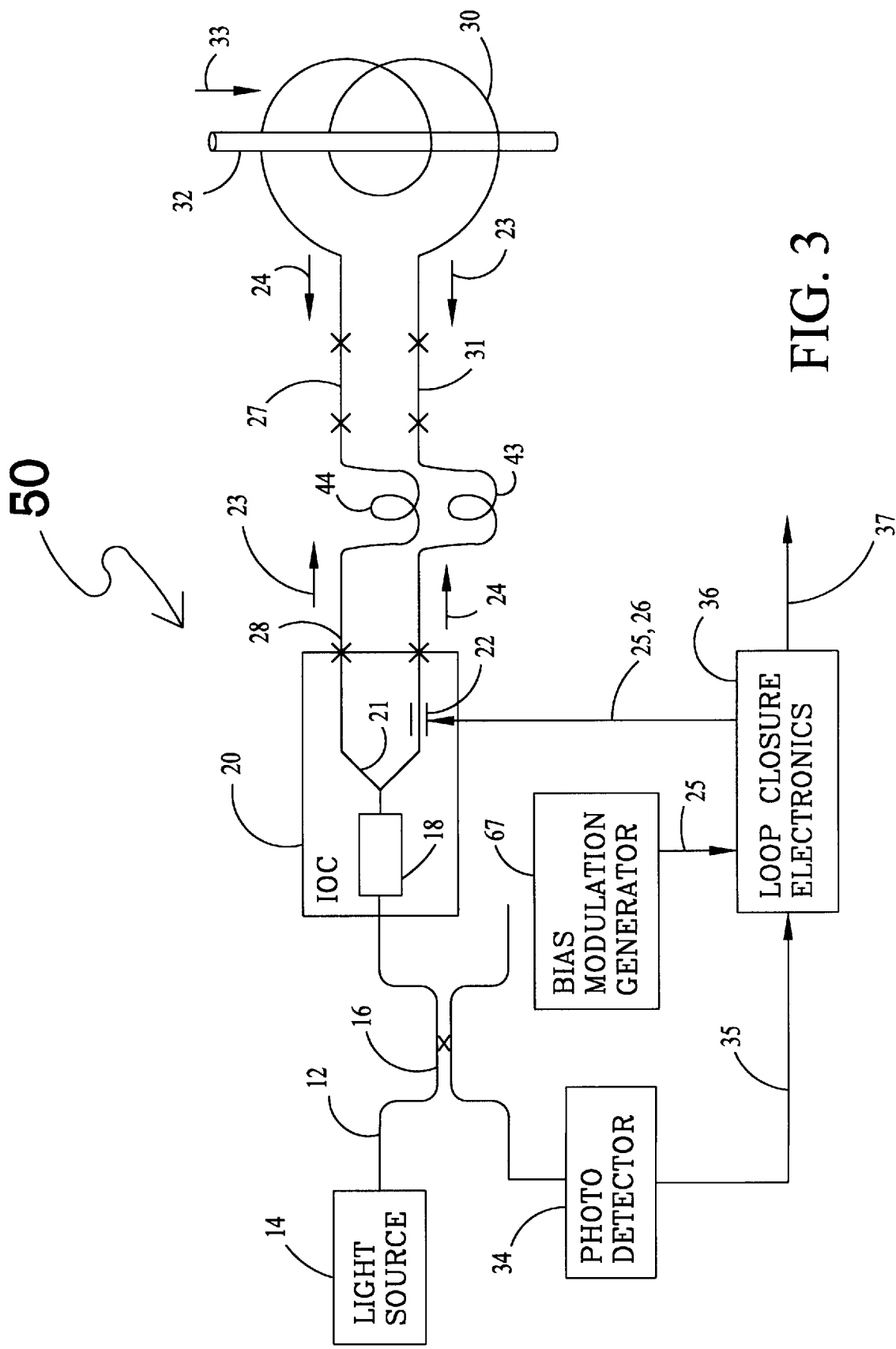
FIG. 3 is a schematic diagram of a Sagnac loop current sensor having compensating delay lines.

FIG. 1b shows the same Sagnac interferometer current sensor as FIG. 1a except that converter 31 is between IOC 20 and rotation compensating coil 29. In FIG. 3, converters 27 and 31 may be between IOC 20 and coils 44 and 43, instead, respectively. Likewise, in FIG. 6, converters 27 and 31 may be instead between coupler 51 and coils 48 and 47 (including flippers 38), respectively.

Quarter wave converter 27 and 31 non-idealities, either arising from angular misalignments or from deviations from quarter wave operation, create only second order errors in sensor 10 output 37. Quarter wave converter errors cause light to be coupled to the unused axis of the polarization maintaining fiber 28 and PM fiber loop 29, but which is eventually rejected by polarizer 18 in its common input/output port.

Fiber optic quarter wave converters 27 and 31 may be constructed from a low birefringence fiber wound around a relatively small diameter. However, the quality of quarter wave converters constructed in this manner has been shown to be poor. An alternative is to use a short length of polarization maintaining fiber. The polarization beat length of the polarization maintaining fiber is preferably long enough to facilitate splicing this fiber between the coil 29 and PM fiber 28 and the sensing coil 30 fiber.

Figure 1C:
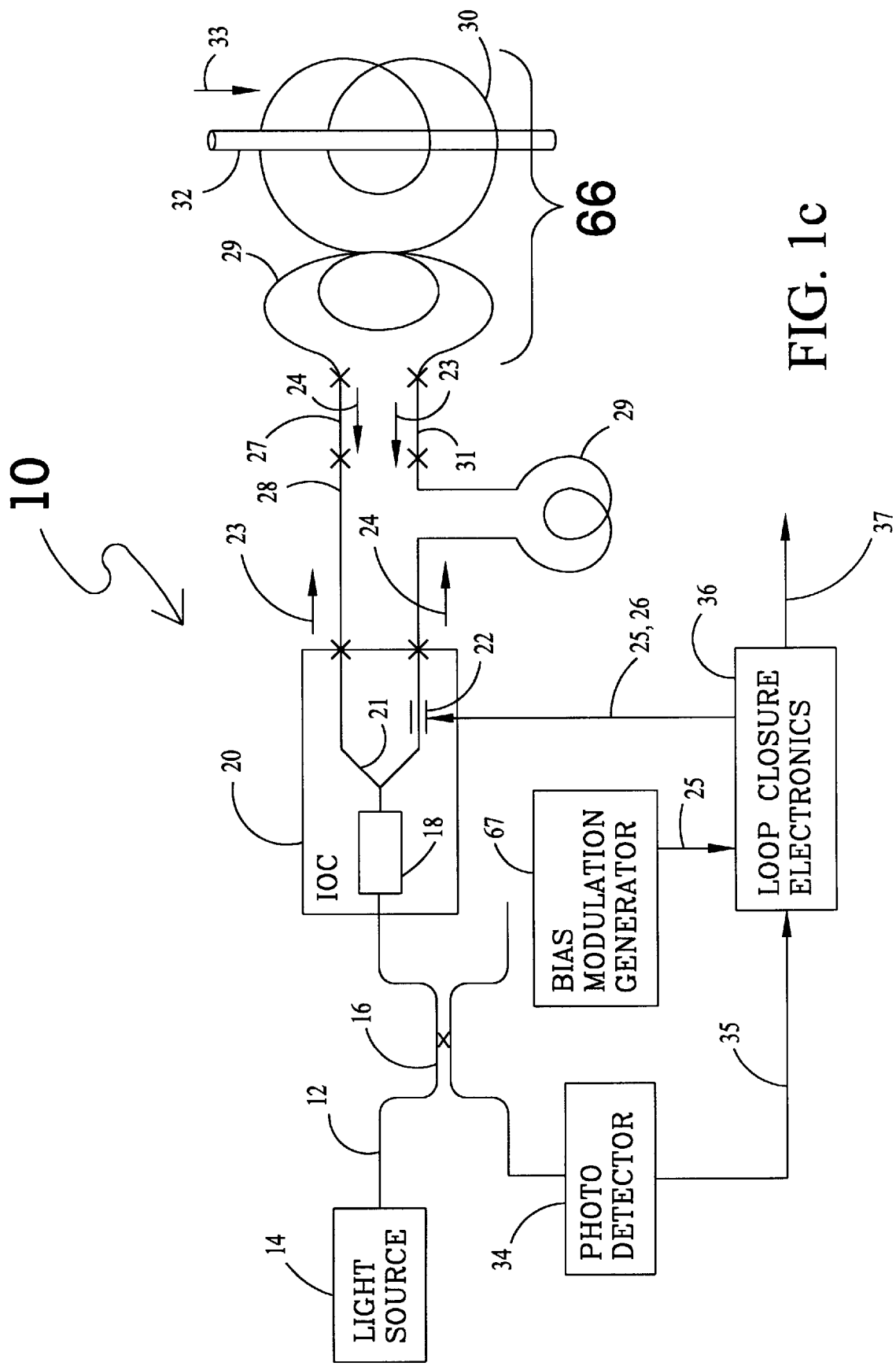
FIG. 1c shows a current sensor wherein the compensating and sensing coils are a continuous wind of optical fiber.

FIG. 1c shows compensating coil 29 and sensing coil 30 wound continuously and not necessarily discretely. These coils may be wound in a pattern, even as one coil 66 likely with a splice-less optical fiber. Resultant coil 66 is substantially insensitive to rotation rate, and at the same time, sensitive to current 33 to be measured. There are various complex or simple winding geometries that can be utilized in the one-coil compensating and sensing configuration.

Figure 2:
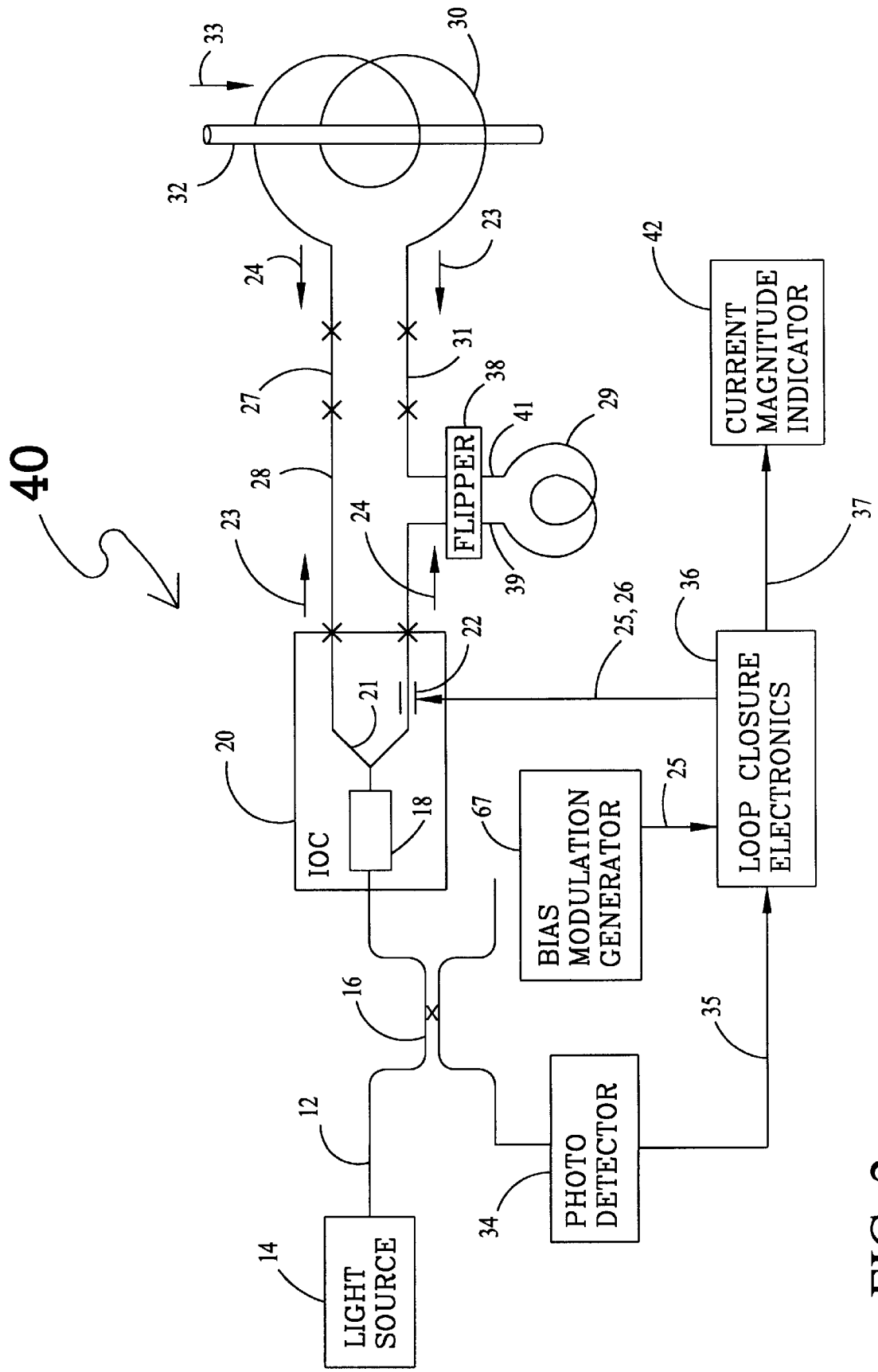
FIG. 2 is a schematic diagram of a Sagnac current sensing loop having a compensating coil or loop that can be flipped.

FIG. 2 shows a sensor 40 that has a rotation compensating coil 29 that may be "flipped" thus reversing its axis of sensitivity or optically switched in its connections, or reversed in polarity with respect to its connections in the optical circuit. "Flipper" 38 provides this connection swap or polarity change whenever desired by the sensor user.

To flip coil 29, lead fiber 39 is disconnected from the fiber connected to IOC 20, and at the same time lead fiber 39 is connected to the fiber connected to converter 31. Also, part of the flip, is the disconnecting of lead fiber 41 from the fiber connected to converter 31 and the connecting of lead fiber 41 to the fiber connected to IOC 20. To flip coil 29 again, lead fibers 39 and 41 are reconnected to the fibers connected to IOC 20 and converter 31, respectively. Alternatively the compensating coil may be mounted on a hinged assembly that simply allows turning the coil over to reverse its axis of sensitivity by nominally 180 degrees. This is also referred to as flipping, since it constitutes another form of axis flipping.

Current indication readings from indicator 42 may be noted before coil 29 is flipped and after coil 29 is flipped. For a zero current sensing situation, any difference of the readings may be zeroed out to calibrate sensor 40 to zero. This permits calibrating the non-reciprocal optical phase shift of light waves 23 and 24 in sensor 40, due to rotation rate with high accuracy. Then to measure current 33, coil 29 is again flipped, making sensor 40 insensitive to rotation and still sensitive to current. Thus, sensor 40 becomes highly calibrated for high accuracy current measurements without rotation sensitivity. Another possibility is to use rotation rate to null out the effects of current when the sensor is sensitive to both. In other words, rotation can be used to null the phase relationship between light waves 23 and 24 changed by electric current 33 while compensating coil 29 is reversed and sensing coil 30 is sensitive to the electric current and the rotation.

FIG. 3 shows a current sensor 50 having a rotation compensation scheme that has a shorter sensing coil 30 and a delay line coil 43. This configuration can be used to lower the proper frequency of sensing coil or loop 30 so that the frequency of bias modulation signal 25 can be low enough for low drift loop closure electronics 36. Delay line coil 43 may be long compared to sensing loop 30. The rotation sensitivity of coil 43 may be of concern. One can use an anti-rotation wound delay coil 44 to null the rotation sensitivity of delay coil 43 in conjunction with short sensing loop 30. The majority of coils 43 and 44 may be wound in the same direction side by side, perhaps in a bifilar winding configuration, but with opposite rotation sensitivities because of the opposite directions of the same light beams in the coils. One may be longer than the other to make the net rotation sensitivity of the sensing coil and the compensating coils equal to zero. The compensating coils may also be wound separately to allow one of them to be flipped.

Although the present invention and its advantages have been described in detail, it should be understood that various changes, substitutions and alterations may be made therein without departing from the spirit and scope of the invention as defined by the appended claims. In many of these cases, the Sagnac fiber loop may be wound continuously, such as in FIG. 1c so that the sensing coil is a monolithic (or splice-less) coil with its own rotation compensation within the winding pattern. It is thus a Sagnac interferometer with no rotation sensitivity.

Figure 4:
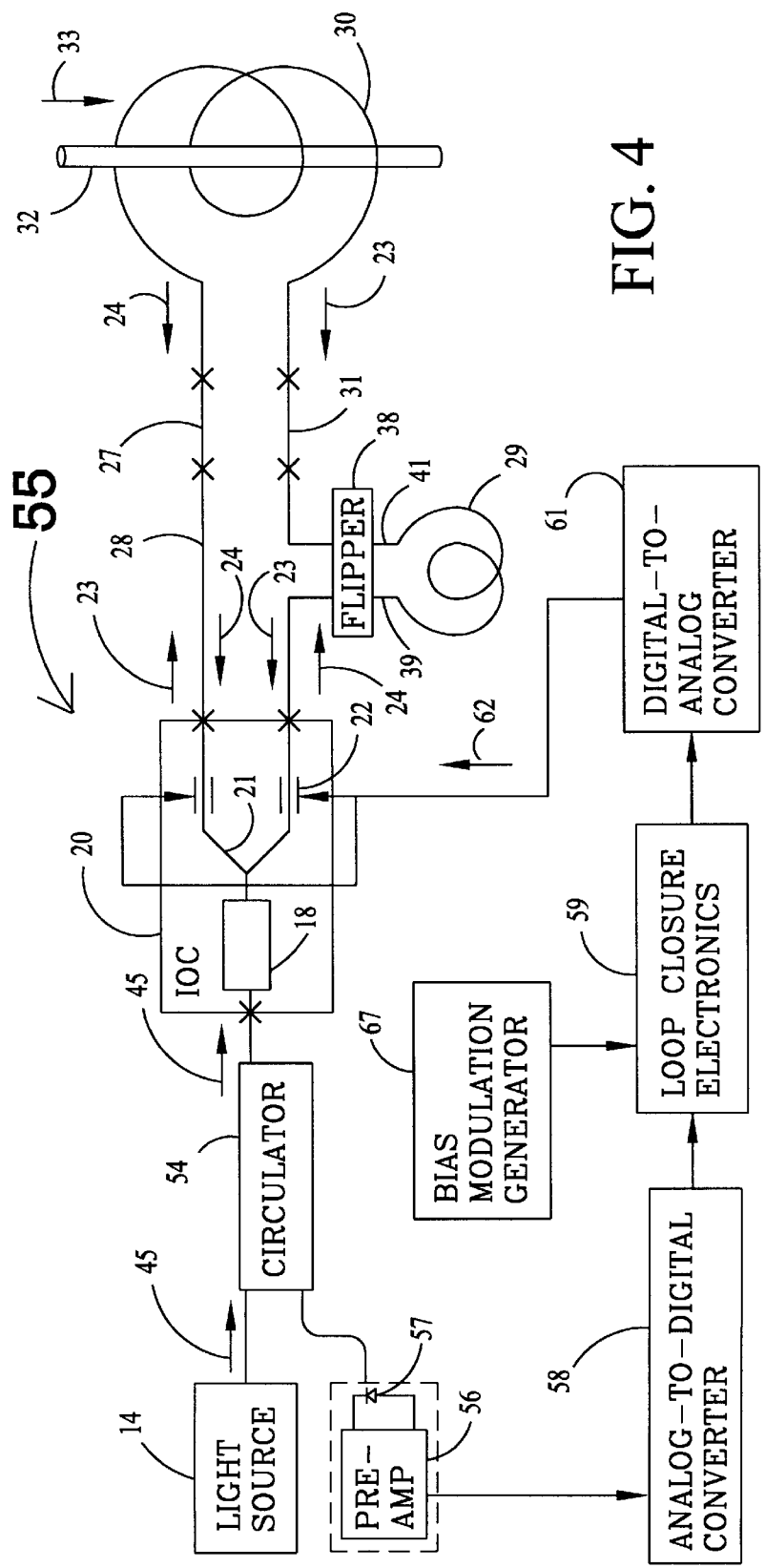
FIG. 4 is a schematic diagram of a Sagnac loop current sensor having an optical circulator.

Some, but not all, of these obvious substitutions include the following configuration 55 in FIG. 4. Coupler 16 in FIG. 2 may be replaced by an optical circulator 54 in FIG. 4, which allows light 45 flow from source 14 to coil 30 without intrinsically losing any power in the forward direction. Likewise, light 23 and 24 returning from coil 30 is all directed to photodetector 34 instead of half of it impinging on light source 14. In this way, circulator 54 saves the 75 percent of light that is lost (round-trip) by a 50/50 coupler. Circulator 54 is like an optical isolator that linearly polarizes light 45 and rotates the polarization of light 45 by 45 degrees in the forward direction via a Faraday rotator. Light returning to circulator 54 is rotated another 45 degrees and thus cannot get through the polarizer of the circulator. If the polarizer is a polarization beam splitter, then the returning light is split off at typically ninety degrees in direction, where it is coupled to photodetector 57 as signal light.

IOC 20 itself may be implemented using lithium niobate proton exchange waveguides, lithium niobate titanium-indiffused waveguides, polymer waveguides, gallium arsenide waveguides, or lithium tantalate waveguides. In addition, the above materials may be used to make only phase modulator 22, with the wye junction 21 and polarizer 18 replaced by a fiber-optic coupler and fiber-optic (or bulk-optic) polarizer, respectively. Another possibility for phase modulator 22 in a closed loop system is use of a bulk-optic, but fiber-pigtailed, electro-optic Pockels cell. The sensing coil 30 fiber can be either a low birefringence annealed fiber, a spun high-circularly birefringent fiber or a fiber that is would in twisted form to create circular birefringence. In all of these coil fiber concepts the sensing fiber is intended to maintain or preserve circular polarizations of light.

Figures 5A, 5B, 5C:
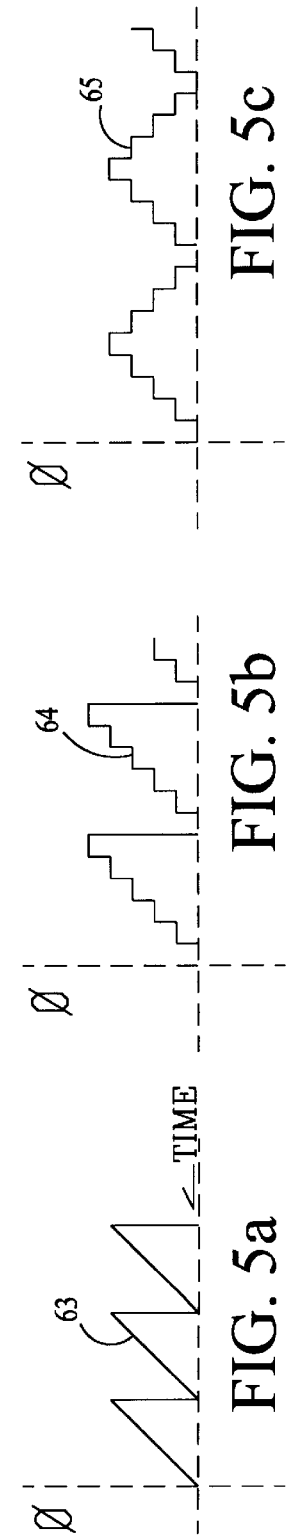
FIGS. 5a, 5b and 5c show various closed-loop feedback waveforms of a Sagnac current sensor.

The loop closure scheme typically involves digitization of the output of a preamplifier 56 attached to the photodetector 57 output signal from an analog voltage to a digital one via an analog-to-digital (A/D) converter 58 in loop closure electronics 59. A/D converter 58 "samples" or converts the preamplifier 56 output to a digital signal representative of the preamp 56 signal periodically, typically several times per half modulation cycle of the bias modulation period of the signal from generator 67. The output of A/D converter 58 is compared between the two half cycles for a signal indicative of current 33 changes. The presence of a current change changes a loop closure waveform signal 62 that is applied to phase modulator 22 via a digital-to-analog (D/A) converter 61. Loop closure waveform signal 62 used to rebalance the phase ($\phi$) between counterpropagating optical waves 23 and 24 in sensing loop 30 may be a sawtooth-type signal 63 (so-called serrodyne ramp), a digital phase step waveform 64 or a dual ramp waveform 65 (in FIGS. 5a, 5b and 5c, respectively). All of these are applied asymmetrically to the two sides of the interferometer loop 30 to take advantage of the time delay in coil 30 and allow a phase difference (equal and opposite to that generated by current 33) between the waves 23 and 24, to be generated. The sawtooth or serrodyne waveform has a gradual phase slope proportional to the electric current 33 magnitude with a rapid flyback or reset of a multiple of $2\pi$ phase shift in size. The dual ramp waveform alternates between a positive-going phase ramp and a negative-going one with the difference in the magnitude of the up-slope and the down-slope being proportional to the electric current. All ramp types are capable of reversing to indicate a reversal in the direction of the current 33 in conductor 32.

Figure 6:
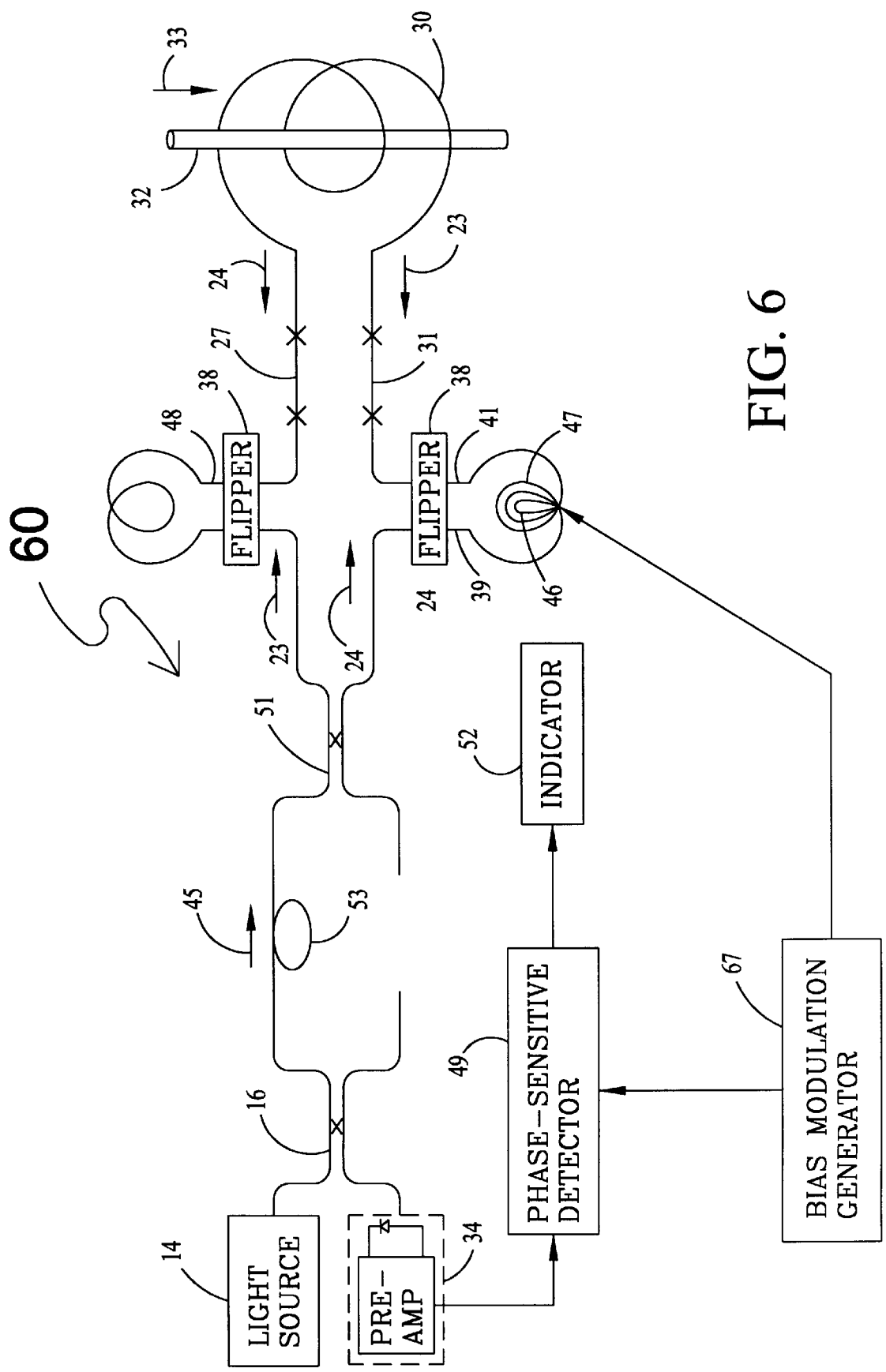
FIG. 6 shows an open-loop configuration of a Sagnac current sensor.

Another configuration 60 is an open loop gyroscope shown in FIG. 6. Light source 14 emits light 45 that goes through coupler 16 and polarizer 53. A coupler 51 is used to split light 45 into a CW wave 23 and a CCW wave 24. The bias phase-difference modulation from generator 67 is imparted to light waves 23 and 24 in Sagnac loop 30 via a voltage applied to a piezo-electric (PZT) cylinder 46 that has fiber 47 wrapped around it. Light waves 23 and 24 go to loop 30 via compensating coil 48 and quarter-wave retarder 27, and PZT fiber coil 47 and quarter-wave retarder 31, respectively. The RSP of a compensating coil 48 must therefore account for not only the RSP of sensing coil 30, but also fiber coil 47 on PZT cylinder 46. Flipper 38 may be omitted. Alternatively, PZT cylinder fiber coil 47 may be used as the compensating coil in lieu of coil 48 and may also be flipped by flipper 38 according to the preceding discussion. The output of the photodetector 34 is preamplified and introduced to a phase sensitive detector (PSD) 49 which is responsive to a signal harmonically related to the bias modulation signal. The output of PSD 49 is then proportional to the instantaneous electric current 33 in conductor 32. Indicator 52 receives the PSD 49 output and converts it to a readable indication of the current 33 magnitude.

What is claimed is:

1. A fiber optic current sensor comprising:
   a light source;
   a coupler connected to said light source;
   a quarter wave converter connected to said coupler;
   a sensing loop connected to said quarter wave converter;
   a rotation sensitivity compensating loop connected to said sensing loop and said coupler; and
   a detector connected to said coupler.

2. The current sensor of claim 1, further comprising a device for reversing the connections of said compensating coil to said splitter and said sensing coil, for calibration purposes.

3. A fiber optic current sensor comprising:
   a light source;
   a coupler connected to said light source;
   a splitter connected to said coupler;
   a polarization converter connected to said splitter;
   a sensing coil connected to said polarization converter;
   a rotation sensitivity compensating coil connected to said splitter and to said sensing coil.

4. The current sensor of claim 3, wherein said compensating coil is a first delay line coil.

5. The current sensor of claim 4, further comprising a second delay line coil connected to said splitter and sensing coil on the other side opposite of that to which the first delay line coil is connected.

6. The current sensor of claim 4, wherein said sensing coil has a rotation sensitivity that is less than the rotation sensitivity of said first delay line coil.

7. The current sensor of claim 6, wherein the rotation sensitivity of said first delay line coil is opposite in polarity to the rotation sensitivity of said sensing coil.

8. The current sensor of claim 7, wherein the sum of the rotation sensitivities of said sensing coil, said first delay line coil and second delay line coil approaches zero.

9. The current sensor of claim 8, wherein said sensing loop is a medium for counter-propagating light waves having a phase relationship.

10. The current sensor of claim 9, wherein the phase relationship is affected by a magnetic field of an electric current proximate to said sensing coil.

11. The current sensor of claim 10, wherein the counter-propagating light waves are directed to a detector via said first and second delay line coils, said splitter, and coupler, and wherein said detector detects the light waves and outputs an electrical signal representing the light waves and the phase relationship.

12. The current sensor of claim 11, having a processing electronics connected to said detector, for outputting a signal that indicates a magnitude of the electric current proximate to said sensing coil, according to the phase relationship.

13. A fiber optic current sensor comprising:
   source means for providing a first light beam;
   splitting means for splitting the first light beam into second and third light beams having a phase relationship, and for combining the second and third light beams;
   sensing means for receiving second and third light beams to counter-propagate in said sensing means, and the phase relationship being changeable by an electric current proximate to said sensing means, and for returning the second and third light beams to said splitting means;
   compensating means for compensating the phase relationship for changes in the phase relationship due to a rotational sensitivity of said sensing means;
   detecting means for detecting the second and third light beams and outputting an electrical signal that indicates the phase relationship of the second and third light beams; and
   indicating means for processing the electrical signal and indicating an amount of electric current proximate to said sensing means.

14. The fiber optic current sensor of claim 13, further comprising:
   polarizing means for polarizing the first light beam; and
   converting means for converting a polarization of the second and third light beams in to another polarization.

15. The fiber optic current sensor of claim 14, further comprising flipping means for reversing the compensating by said compensating means for changes in the phase relationship caused by the rotational sensitivity of said sensing means.

16. The fiber optic current sensor of claim 15, wherein inertial rotation can be used to null the phase relationship changed by the electric current while said compensating means is reversed and said sensing means is sensitive to the electric current and the rotation.

17. The fiber optic current sensor of claim 15, wherein said flipping means is for calibration of said fiber optic current sensor.

18. The fiber optic current sensor of claim 13 wherein inertial rotation is used to null said phase relationship changed by any electric current while said compensating means is reversed and sensing means is sensitive to both electric current and rotation.

19. A fiber optic current sensor comprising:
   a light source;
   a polarizer connected to said light source;
   a splitter having a first port connected to said polarizer, and having second and third ports;
   a first linear/circular polarization converter having a first end connected to the second port of said splitter;
   a sensing coil having a first end connected to a second end of said first linear/circular polarization converter, and having a second end;
   a first rotation sensitivity compensating coil having a first end connected to the second end of said sensing coil, and having a second end connected to the third port of said splitter; and
   a detector coupled to said polarizer.

20. The fiber optic current sensor of claim 18, further comprising:
   a phase modulator connected to said splitter;
   a signal processor connected to said detector and to said phase modulator; and
   a bias modulation generator connected to said signal processor.

21. The fiber optic current sensor of claim 19, further comprising a second linear/circular polarization converter between said first rotation sensitivity compensating coil and said sensing coil, having a first end connected to the first end of said first rotation sensitivity compensating coil and a second end connected to the second end of said sensing coil.

22. The fiber optic current sensor of claim 21, further comprising an optical switch connected between the first and second ends of said first compensating coil and the first end of said second linear/circular polarization converter and the third port of said splitter, wherein said optical switch can interchange the connections of the first and second ends of said compensating coil.

23. The fiber optic current sensor of claim 22, further comprising a second compensating coil having a first end connected to the second port of said splitter, and having a second end connected to the first end of said first linear/circular polarization converter.

24. The fiber optic current sensor of claim 23, wherein said first and second compensating coils are delay line coils.

25. The fiber optic current sensor of claim 20, further comprising a second linear/circular polarization converter between said first rotation sensitivity compensating coil and said splitter, having a first end connected to the third port of said splitter and a second end connected to the second end of said first rotation sensitivity compensating coil.

26. The fiber optic current sensor of claim 25, further comprising a second rotation sensitivity compensating coil having a first end connected to the second end of said first linear/circular polarization converter and a second end connected to the first end of said sensing coil.

27. The fiber optic current sensor of claim 26, further comprising an optical switch connected between the first and second ends of said first compensating coil and the second end of said sensing coil and the second end of said second linear/circular polarization converter, wherein said optical switch can interchange the connections of the first and second ends of said first compensating coil.

28. A fiber optic current sensor comprising:
   a broadband light source for providing a first beam of light;
   a coupler connected to said light source;
   an integrated optical circuit having a first port connected to said coupler and having second and third ports, wherein said integrated optical circuit polarizes the first beam of light and splits the first beam of light into second and third beams of light, which exit the second and third ports, respectively;
   a polarization maintaining fiber having a first end connected to the second port of said integrated optic circuit and having a second end;
   a first polarization converter having a first end connected to the second end of the polarization maintaining fiber, and having a second end;
   an optical fiber sensing coil having a first end connected to the second end of said first polarization converter, and having a second end, wherein said sensing coil has a first rotational sensitivity;
   a second polarization converter having a first end connected to the second end of said sensing coil, and having a second end;
   an optical fiber compensating coil having a first end connected to the second end of said second polarization converter, and having a second end connected to the third port of said integrated optic circuit, wherein said compensating coil has a second rotational sensitivity that is approximately equal and opposite to the first rotational sensitivity of said sensing coil; and
   a detector connected to said coupler.

29. The fiber optic current sensor of claim 28, wherein:
   the second beam of light propagates through the polarization maintaining fiber, the first polarization converter, the sensing coil, the second polarization converter, and the compensating coil to the third port of said integrated optical circuit;
   the third beam of light propagates through the compensating coil, the second polarization converter, the sensing coil, the first polarization converter and the polarization maintaining fiber to the second port of said integrated optical circuit;
   the counter-propagating second and third beams in said sensing loop have a phase relationship that can be affected by a current flowing in a conductor that is proximate to said sensing coil;
   the second and third beams entering the third and second ports of said integrated optical circuit are combined into a fourth beam of light to exit the first port of said integrated optical circuit into said coupler;
   said detector receives said fourth beam of light from said coupler, and converts the fourth beam of light into an electrical signal representative of information indicating the phase relationship of the second and third beams of light returning to said integrated optical circuit; and
   the phase relationship is indicative of a magnitude of the current flowing in the conductor proximate to said sensing coil.

30. A fiber optic current sensor comprising:
   a broadband light source for providing a first beam of light;
   a circulator connected to said light source;
   an integrated optical circuit having a first port connected to said circulator and having second and third ports, wherein said integrated optical circuit polarizes the first beam of light and splits the first beam of light into second and third beams of light, which exit the second and third ports, respectively;
   a polarization maintaining fiber having a first end connected to the second port of said splitter and having a second end;
   a first polarization converter having a first end connected to the second end of the polarization maintaining fiber, and having a second end;
   an optical fiber sensing coil having a first end connected to the second end of said first polarization converter, and having a second end, wherein said sensing coil has a first rotational sensitivity;
   a second polarization converter having a first end connected to the second end of said sensing coil, and having a second end;
   an optical fiber compensating coil having a first end connected to the second end of said second polarization converter, and having a second end connected to the third port of said splitter, wherein said compensating coil has a second rotational sensitivity that is approximately equal and opposite to the first rotational sensitivity of said sensing coil; and
   a detector connected to said circulator.

31. The fiber optic current sensor of claim 30, wherein:
   the second beam of light propagates through the polarization maintaining fiber, the first polarization converter, the sensing coil, the second polarization converter, and the compensating coil to the third port of said integrated optical circuit;
   the third beam of light propagates through the compensating coil, the second polarization converter, the sensing coil, the first polarization converter and the polarization maintaining fiber to the second port of said integrated optical circuit;

the counter-propagating second and third beams in said sensing loop have a phase relationship that can be affected by a current flowing in a conductor that is proximate to said sensing coil;

the second and third beams entering the third and second ports of said integrated optical circuit are combined into a fourth beam of light to exit the first port of said integrated optical circuit into said circulator;

said detector receives said fourth beam of light from said circulator, and converts the fourth beam of light into an electrical signal representative of information indicating the phase relationship of the second and third beams of light returning to said integrated optical circuit; and the phase relationship is indicative of a magnitude of the current flowing in the conductor proximate to said sensing coil.

32. A fiber optic current sensor comprising:

a light source;

a polarizer coupled to said light source;

a splitter having a first port connected to said polarizer, and having second and third ports;

a polarization converter having a first end connected to the second port of said splitter; and a sensing coil, having a first end connected to the second end of said polarization converter and a second end connected to the third port of said splitter, having a winding pattern that is substantially insensitive to rotation rate, and sensitive to current for measurement of current magnitude.

33. A method for operating a Sagnac-type fiber optic current sensor comprising the steps of:

passing first and second light waves through an optical path wherein the phase relationship therebetween is responsive to an electric current proximate said optical path and any rotation about a first sensing axis;

passing third and fourth waves through a second optical path wherein the phase relationship therebetween is insensitive to said electrical current and sensitive to any rotation about a sensing axis thereof in alignment with said sensing axis of said first optical path with a sensing direction of opposite sign;

detecting a first phase change representative of any phase change between said first and second light waves, and a second phase change representative of any phase change between said third and fourth light waves, and providing an output signal indicative of a function of said first and second phase changes.

34. The method of claim 33 wherein said first and second optical paths form one continuous light path;

said first light wave enters said first optical path, travels through said first optical path, enters said second optical path as said third light wave and exits therefrom;

said fourth light wave enters said second optical path, travels through said second optical path, and enters said first optical path as said second light wave and exits therefrom; and a detector is responsive to any phase change between said second light wave exiting said first optical path and said third wave exiting said second optical path.

35. The method of claim 34 further comprising the step of adding inertial rotation about said first axis so as to null any phase change between said second and third light waves caused by said electric current.

* * * * *